(12) United States Patent
Wagner et al.

(10) Patent No.: US 9,195,886 B2
(45) Date of Patent: Nov. 24, 2015

(54) RAPID PROTOTYPING AND MACHINE VISION FOR RECONFIGURABLE INTERFACES

(75) Inventors: Christopher R. Wagner, Simi Valley, CA (US); Amanda Christiana, Ann Arbor, MI (US); Douglas Haanpaa, Dexter, MI (US); Charles J. Jacobus, Ann Arbor, MI (US)

(73) Assignee: Cybernet Systems Corporation, Ann Arbor, MI (US)

( * ) Notice: Subject to any disclaimer, the term of this patent is extended or adjusted under 35 U.S.C. 154(b) by 1735 days.

(21) Appl. No.: 12/351,332

(22) Filed: Jan. 9, 2009

(65) Prior Publication Data

US 2009/0184809 A1    Jul. 23, 2009

Related U.S. Application Data

(60) Provisional application No. 61/020,013, filed on Jan. 9, 2008.

(51) Int. Cl.
*G06K 9/00* (2006.01)
*G08B 6/00* (2006.01)
*H03K 17/94* (2006.01)

(52) U.S. Cl.
CPC .............. *G06K 9/00355* (2013.01); *G08B 6/00* (2013.01); *H03K 17/94* (2013.01)

(58) Field of Classification Search
CPC ............. G08B 6/00; H03K 17/94; G06K 9/00

USPC ............ 340/971, 407.1, 407.2; 200/512–517, 200/402, 406, 211, 212, 280, 281, 295, 333, 200/341–345

See application file for complete search history.

(56) References Cited

U.S. PATENT DOCUMENTS

| 5,544,842 | A | * | 8/1996 | Smith et al. ................... 244/1 R |
| 2003/0183497 | A1 | * | 10/2003 | Johnston et al. .............. 200/512 |
| 2007/0192724 | A1 | * | 8/2007 | Devore et al. ................. 715/772 |
| 2008/0226134 | A1 | * | 9/2008 | Stetten et al. ................. 382/114 |

* cited by examiner

*Primary Examiner* — Jennifer Mehmood
*Assistant Examiner* — Omar Casillashernandez
(74) *Attorney, Agent, or Firm* — Dinsmore & Shohl LLP

(57) ABSTRACT

A system and method including software to aid in generation of panels and control instruments rapidly generates a station that can support a variety of control interfaces. Rapid-Prototyped Panels, or RP-Panels, replicate existing systems (for simulation, training, gaming, etc.) or from new designs (for human factors testing, as functional product, etc.). The controls have tactile and visual characteristics similar or identical to their functional component counterparts such as buttons, knobs, switches, pedals, joysticks, steering wheels, and touch panels but are modular and use alternative data transfer modes (potentiometers, fiber optics, RFID, machine vision, etc.) to track and analyze the response of the controls. The response is then transmitted to the host programs. With this method a user can design and fabricate a reconfigurable interface to interact with virtual environments for various applications such as simulation, training, virtual instrumentation, gaming, human factors testing, etc.

8 Claims, 3 Drawing Sheets

RAPID PROTOTYPING AND MACHINE VISION FOR RECONFIGURABLE INTERFACES

REFERENCE TO RELATED APPLICATION

This application claims priority from U.S. Provisional Patent Application Ser. No. 61/020,013, filed Jan. 9, 2008, the entire content of which is incorporated herein by reference.

GOVERNMENT SUPPORT

This invention was made with Government support under Contract No. N61339-07-C-0085 awarded by the United States Navy. The Government has certain rights in the invention.

FIELD OF THE INVENTION

This invention relates generally to human-machine interfaces and, in particular, to interfaces that use rapid prototyping technology to fabricate interfaces with desired functional and haptic responses.

BACKGROUND OF THE INVENTION

In many situations, a complex simulation interface is useful for training. For example, pilots would like to train in a flight simulator using mission specific data. These simulators often take up a large amount of space, particularly if one simulator exists for each type of interface (e.g. each aircraft cockpit).

What is needed is a reconfigurable simulator that can faithfully replicate the look and feel (sense of touch) of a number of different interfaces. Simulating the sense of touch, or haptic, aspect of a range of interfaces is a particularly difficult task due to the sensitivity of the human tactile system. Current haptic interface technologies are unable to faithfully recreate the large range of tactile stimuli encountered when interacting with interface components such as buttons, knobs, etc. common to interfaces.

SUMMARY OF THE INVENTION

This invention relates generally to human-machine interfaces and, in particular, to interfaces that use rapid prototyping technology to fabricate interfaces with desired functional and haptic responses. The embodiments include software to aid in generation of panels and control instruments rapidly construct panels that can support a variety of control interfaces. These panels can replicate existing systems (for simulation, training, gaming, etc.) or create new designs (for human factors testing, as functional product, etc.).

The controls may have tactile and/or visual characteristics similar or identical to their functional component counterparts such as buttons, knobs, switches, pedals, joysticks, steering wheels, and touch panels but are modular and use alternative data transfer modes (potentiometers, fiber optics, RFID, machine vision, etc.) to track and analyze the response of the controls. The response is then transmitted to the host programs. By virtue of the invention, a user can design and fabricate a reconfigurable interface to interact with virtual environments for various applications such as simulation, training, virtual instrumentation, gaming, human factors testing, etc.

A method of forming a human-machine interface according to the invention includes the step of providing a scaffold enabling different interface components to be positioned at different locations on the scaffold. One or more of the interface components are fabricated with a rapid prototyping technology. Such components feature a physical structure that provides a specified functional response. The components are mounted on the scaffold in accordance with a given application.

The functional response may include a haptic response. For example, the interface component may be a pushbutton, in which case the haptic response may include the depth of travel or the stiffness of the pushbutton. In a specific embodiment, the interface component may be a pushbutton with a frame, a button portion, and compliant tabs coupling the button portion to the frame, and the haptic response may include the depth of travel or the stiffness of the pushbutton determined by the size, shape or composition of the compliant tabs.

Alternatively, the interface component may include a location to be touched by a user, in which case the specified functional response is determined through machine vision extraction of the touch location. A human-machine interface constructed in accordance with the invention broadly includes a plurality of user input devices, at least certain of which are fabricated with a rapid prototyping technology, wherein at least some of the user input devices are fabricated with a rapid prototyping technology include physical features that are sized, shaped or composed to yield a desired functional response.

DETAILED DESCRIPTION OF THE INVENTION

This invention takes advantage of progress made in rapid prototyping technology. Rapid prototyping machines are increasing in prevalence due to their increase in resolution, speed, and value. These machines are essentially 3D printers. Given a software description of a solid component, a rapid prototyping machine can build up a physical solid to those specifications in a manner of minutes to hours. Applicable technologies include Selective Laser Sintering (SLS); Fused Deposition Modeling (FDM); Stereolithography (SLA); Photopolymer Laminated Object Manufacturing (LOM); Electron Beam Melting (EBM); and "3D Printing" (3DP). This invention is not limited in this regard however, as it may take advantage of these as well as any yet-to-be developed alternatives.

The inventive approach to reconfigurable displays take advantage of these rapid prototyping machines, where new interface structures and components can be printed then easily configured into a working simulation. Because haptic fidelity is a priority for those components that need to be accessed "by touch," this invention uses a combination of technologies enabling an actual button or knob component to give perfect haptic fidelity in conjunction with rapidly prototyped interface components. This allows for tradeoffs between haptic fidelity and storage space—using actual components for those high priority buttons and knobs that need to be found "by touch," and using rapidly prototyped components for lower priority buttons that do not need to be physically stored until time of use.

Figure 1A:
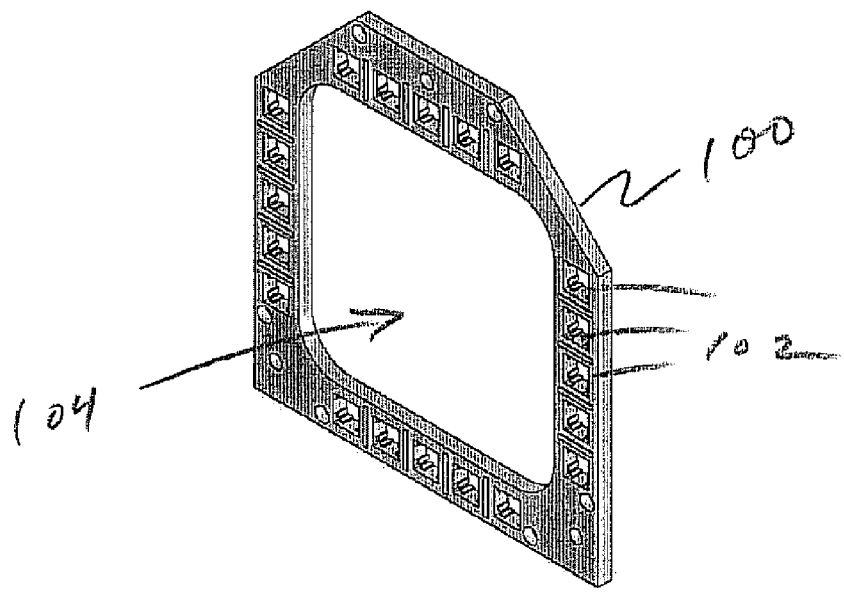
FIG. 1A shows scaffolding for a multifunction display.

According to the invention, certain human interface components are fabricated with rapid prototyping technology. FIG. 1A shows scaffolding for a multifunction display, where actual components can be positioned precisely. The scaffolding of FIG. 1A includes a frame 100 with various holes 102 and an aperture 104 enabling user controls and a central display to be 'snapped' into position. These controls may either be stored physical components or rapidly prototyped elements, depending upon operational criticality or other factors.

Figure 1B:
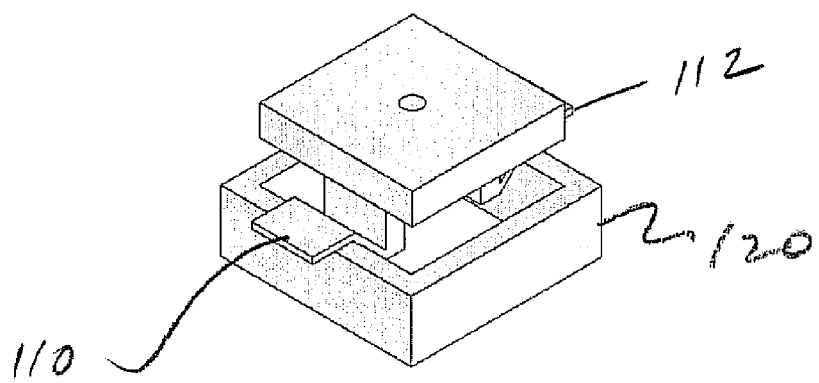
FIG. 1B shows a rapidly prototyped assembled button mechanism, where compliant tabs provide a specified haptic response (depth of travel, stiffness) as well as an optical change enabling machine vision extraction.
Figure 1C:
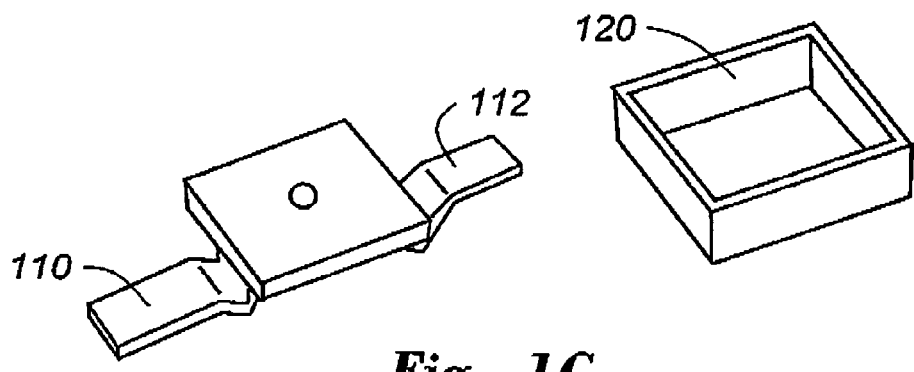
FIG. 1C shows the button mechanism of FIG. 1B in an exploded form.

FIG. 1B shows a rapidly prototyped button mechanism in an assembled form, where compliant tabs 110, 112 provide a specified haptic response (depth of travel, stiffness) as well as an optical change enabling machine vision extraction. FIG. 1C shows the button mechanism of FIG. 1B in an exploded form. The tabs 110, 112 interact with a frame 120. By providing inputs associated with the desired haptic response, the components may be 'written' with rapid prototyping technology to provide the dimensions, thicknesses and other physical parameters to achieve a target 'look and feel' and functional response.

Figure 1D:
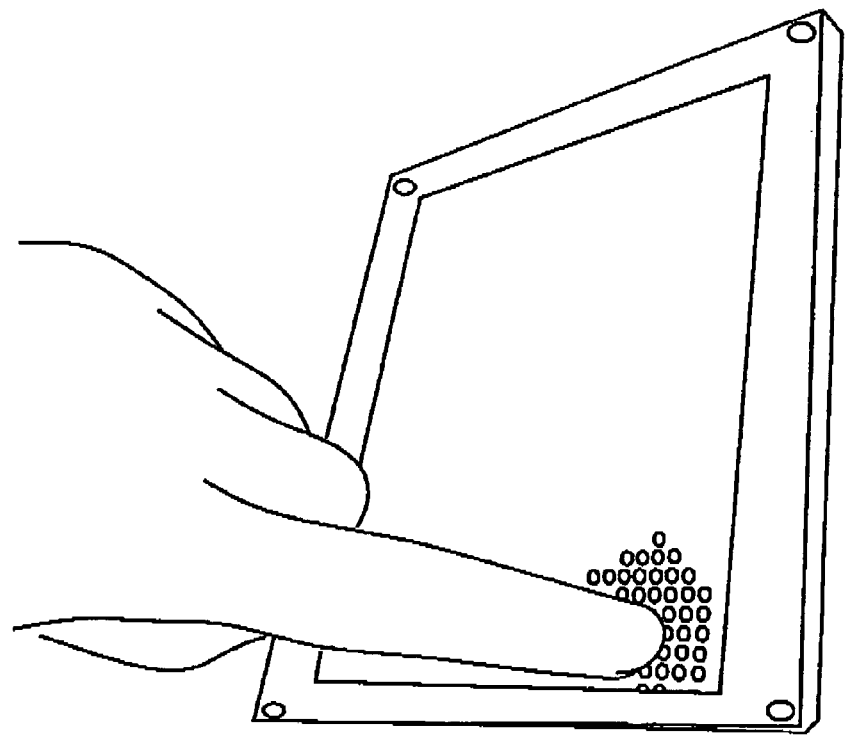
FIG. 1D shows a rapidly prototyped touch panel.

Another advantage of rapidly prototyping interface components is that monolithic, functional interfaces can be printed by rapid prototyping machines in a single pass, requiring no assembly before use. FIG. 1D shows a rapidly prototyped touch panel, where an interference grating is used to transform a small applied force into a large optical change, again enabling machine vision extraction of touch location. The structure of FIG. 1D uses only rapid prototyped components. This design demonstrates how rapid prototyping can combine structural with functional interface components.

Figure 2:
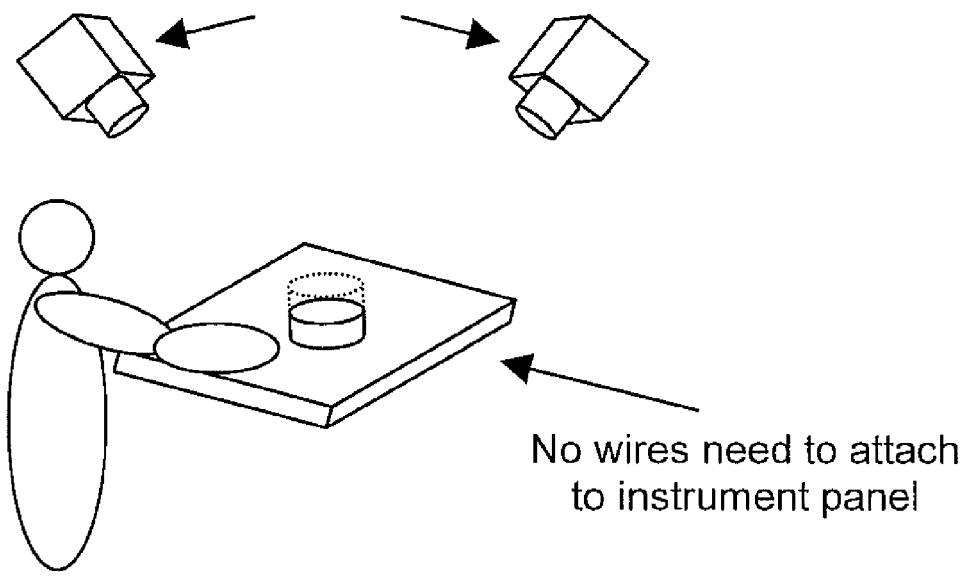
FIG. 2 depicts a machine vision interface state extraction embodiment.

A machine vision interface state extraction embodiment is shown in FIG. 2. Cameras are used to extract position of actual buttons and switches, maintaining haptic feel, without having to reconnect every button and switch upon reconfiguration. When used in conjunction with rapidly prototyped interface components, these components can be optimized to undergo a large optical change during a state change (e.g. button press).

This invention also incorporates machine vision technologies that enable this optimally "mixed fidelity" approach to haptically simulating cockpit interfaces. The main difficulty with using either real components or rapidly-prototyped components is that electrical wiring each interface component would be too time consuming to be practical. Instead, we have developed machine vision technologies that can extract button positions (or knob orientations, etc.) from a camera view of the interface. This way, no wiring is needed, and different cockpit interface panels can be interchanged quickly with no loss in functionality.

A primary advantage of using physical structures for interface components is that the haptic realism is near perfect, and cannot be matched by today's haptic simulation technology. These components can also be reused and quickly reconfigured simply by placing rapidly prototyped panels into specified locations.

We claim:

1. A method of forming a human-machine interface, comprising the steps of:
    providing a scaffold enabling different interface components to be positioned at different locations on the scaffold;
    fabricating one or more of the interface components with a rapid prototyping technology, including components with physical features providing a specified functional response;
    mounting the components on the scaffold in accordance with a given application;
    wherein the interface component includes a location to be touched by a user; and
    the specified functional response is determined through machine vision extraction of the touch location.

2. A human-machine interface, comprising:
    a plurality of user input devices, at least certain of which are fabricated with a rapid prototyping technology;
    wherein at least some of the user input devices fabricated with a rapid prototyping technology include physical features that are sized, shaped or composed to yield a desired functional response;
    wherein at least some of the user input devices are in positioned in different touch locations; and
    wherein the specified functional response for a particular user input device is determined through machine vision extraction of the location of that user input device.

3. The human-machine interface of claim 2, wherein the user input devices are assembled onto a scaffold, enabling different devices to be positioned at different locations in accordance with a given application.

4. The human-machine interface of claim 2, wherein the user input devices are assembled onto a scaffold, enabling different devices to be positioned at different locations in accordance with a given application.

5. The human-machine interface of claim 2, wherein the desired functional response includes a haptic response.

6. The human-machine interface of claim 2, wherein:
    the desired functional response includes a haptic response;
    the interface component is a pushbutton; and
    the haptic response includes the depth of travel or the stiffness of the pushbutton.

7. The human-machine interface of claim 2, wherein:
    the desired functional response includes a haptic response;
    the interface component is a pushbutton with a frame, a button portion, and compliant tabs coupling the button portion to the frame; and
    the haptic response includes the depth of travel or the stiffness of the pushbutton determined by the size, shape or composition of the compliant tabs.

8. The human-machine interface of claim 2, wherein the user input devices are assembled onto a scaffold, enabling different devices to be positioned at different locations in accordance with a cockpit configuration.

* * * * *